March 25, 1969 D. G. GRABBE 3,434,204

INTERCONNECTION STRUCTURE AND METHOD OF MAKING SAME

Original Filed Jan. 19, 1965

INVENTOR.
DIMITRY G. GRABBE

United States Patent Office 3,434,204
Patented Mar. 25, 1969

3,434,204

INTERCONNECTION STRUCTURE AND METHOD OF MAKING SAME

Dimitry G. Grabbe, Sea Cliff, N.Y., assignor to Photo-circuits Corporation, Glen Cove, N.Y., a corporation of New York Original application Jan. 19, 1965, Ser. No. 426,506, now Patent No. 3,386,009, dated May 28, 1968. Divided and this application May 26, 1967, Ser. No. 649,775
Int. Cl. B01 *17/00;* H01l *1/16;* H05k *3/30*
U.S. Cl. 29—577 6 Claims This invention relates to interconnection structures for solid-state circuit members and to methods of making such structures. More particularly, the invention relates to structures for interconnecting solid-state members such as integrated circuits with multilayer printed circuit structures and to methods of making such interconnections.

This application is a division of my copending application Ser. No. 426,506 filed Jan. 19, 1965, now Pat. No. 3,386,009.

Solid-state integrated circuits may be manufactured by the deposition of multiple arrays of patterns on a large silicon chip of dimensions approximately 1 inch by 1 inch. The area of a single integrated circuit may be, for example, .08 inch by .08 inch.

After the various layers of conductors, insulators and the like have been deposited and diffused into the silicon chip as required, a layer of terminating conductive network is deposited on the chip to provide interconnection from each integrated circuit to external circuits. Such terminations usually consist of a circular tab connected to the integrated circuit by a narrow conductor path having a width of approximately .001 inch to .002 inch. The diameter of the termination tab or land is usually approximately .005 inch. Thereafter the silicon chip may be covered with silicon oxide or some other protective layer leaving the terminal land exposed.

The individual integrated circuits of the large silicon chip are then tested for acceptability of operating characteristics and the individual circuits which do not have acceptable operating characteristics are rejected when the large silicon chip is cut into individual small chips representing the individual integrated circuits. The yield of acceptable chips may be 50% or less at this stage of manufacture.

The individual integrated circuit chips are then attached to a support or header which may be a suitable ceramic or glass with clearance holes for the terminal leads of the header to be connected to the idividual integrated circircuits. The terminal leads are attached to the header by means of individual glass seals. The interconnection between the terminal leads of the header and the integrated circuits may be provided by individual gold or aluminum wires integral with or soldered to the terminal leads of the header. The wire, which is approximately .002 inch in diameter, is fitted through a glass capillary tube and while a portion of the wire extends from the tube, the tip of the wire is melted with a gas flame, thus forming a sphere of approximately .004 inch to .005 inch in diameter. The wire is then drawn, pulling the sphere tightly against the end of the capillary tube. The silicon chip, to which the wire is to be connected, is heated to approximately 450° C. and the sphere is forced against the metalized land of the silicon chip with sufficient pressure to deform the wire to achieve a thermo-compression bond.

A thermo-compression bond has an interface where the oxide layers covering the two metals of the bond have been mechanically fractured. The interface of the two metals is stressed and a bond is achieved which, however, maintains a clear and distinct line of separation on a microscopic scale between the two metals. After the wires have been connected to the integrated circuits in the manner described, an additional test of the circuits for acceptable operating characteristics is made, and the yield of acceptable circuits is further reduced by, for example, 50% or more.

It is an object of the present invention, therefore, to provide a new and improved method of making interconnection structures for solid-state circuit members.

It is another object of the invention to provide a new and improved method of making printed circuit structures for solid-state circuit members which provides a higher yield of solid-state circuit members than has heretofore been readily obtainable.

It is another object to the invention to provide a new and improved interconnection structure for solid-state circuit members which is of simple construction.

It is another object of the invention to provide a new and improved solid-state circuit member which is adapted for interconnection with terminals of a supporting header.

In accordance with the invention, a method of making an interconnection structure for a solid-state member comprises positioning a solid-state member having terminal regions at an edge thereof on a support having conductive terminals extending through a surface thereof in a predetermined pattern corresponding to the terminal regions of the solid-state member with the terminal regions of the solid-state member in close proximity to and in register with the terminals of the support. The method includes the step of masking the support and the solid-state member to expose the terminals of the support and the terminal regions of the solid-state member. The method also includes the step of depositing conductive material on the terminals of the support and the terminal regions of the solid-state member to bond together the terminals of the support and the terminal regions of the solid-state member.

Also, in accordance with the invention, a solid-state circuit member comprises a semiconductor member having terminal regions and regions of different electrical characteristics connected to the terminal regions. The terminal regions are positioned at the edges of the semiconductor member.

For a better understanding of the present invention, together with other and further objects thereof, reference is made to the following description, taken in connection with the accompanying drawings, and its scope will be pointed out in the appended claims.

Referring now to the drawings.

Figure 1:
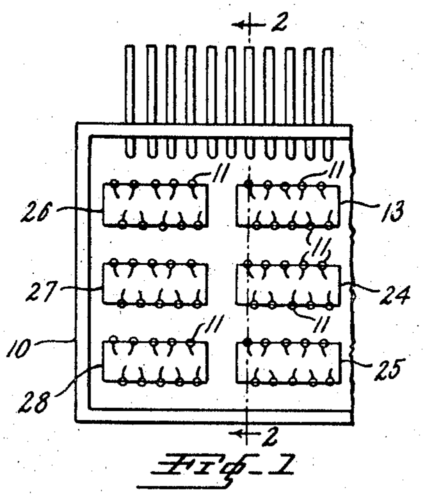
FIG. 1 is a fragmentary plan view of an interconnection structure constructed in accordance with the invention.

Referring now more particularly to FIG. 1 of the drawings, the interconnection structure there represented may be generally similar to the structure described and claimed in copending application Ser. No. 415,211, filed Dec. 1, 1964, now abandoned, by Robert L. Swiggett and Dimitry G. Grabbe entitled "Multilayer Printed Circuit Interconnection Structure and Method of Making Same." The interconnection structure of FIG. 1 preferably comprises an insulating support 10 having terminals extending therethrough in predetermined patterns. The insulating support preferably is a glass or plastic support into which pins or terminals 11 of Kovar (nickel-copper) or other suitable conductive material, for example, copper are accurately embedded with spacing of, for example, .025 inch between adjacent terminals 11. Solid-state circuit members are connected to one surface of the support.

Figure 2:
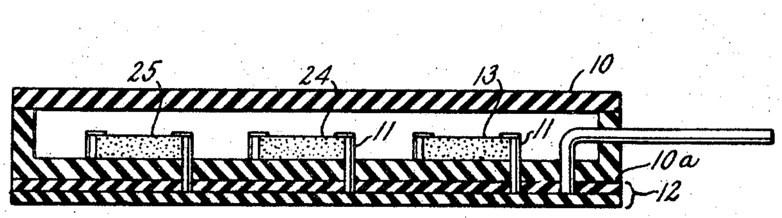
FIG. 2 is a sectional view, to an enlarged scale, taken along lines 2—2 of FIG. 1.

As is apparent in FIG. 2, the terminal 11 extend through one surface of the support to form connections with solid-state circuit members. The terminals 11 preferably are machined to be coplanar or flush with the other surface of the support although selected terminals may extend beyond the plane of the other surface of the support as desired. The solid-state circuit members are connected to the terminals 11 in a manner more fully described subsequently. The solid-state circuit members may then be encapsulated or sealed by a suitable cover.

Preferably, a multilayer interconnection network 12 adherent to the surface 10*a* of the support is utilized to interconnect the terminals of the support in a desired manner. The multilayer interconnection network preferably is made by the method described and claimed in the above-mentioned copending application. A layer of printed circuit conductors having selected terminal regions preferably is formed on the insulating support. A photosensitive insulating layer is formed on the layer of conductors and on the support and the insulating layer is photo-chemically removed over the terminal regions. A second layer of printed circuit conductors is then formed over the insulating layer and is selectively conductively connected to the conductors of the first layer at the terminal regions.

It should be understood that for some applications conventional methods of making mutlilayer printed circuit structures may also be utilized. Moreover, for some applications a single layer printed circuit interconnection network may be sufficient.

Figure 3:
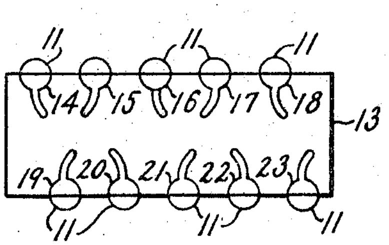
FIG. 3 is an enlarged fragmentary plan view of a portion of the FIG. 1 structure representing the terminals of the support and the terminals of an integrated circuit solid-state member, positioned prior to bonding.

Referring now more particularly to FIG. 3, a solid-state circuit member constructed in accordance with the invention comprises a solid-state semiconductor member 13 having terminal regions 14–23, inclusive, and regions of different electrical characteristics connected to the terminal regions. The solid-state member may be of any desired semiconductor type, for example, an integrated circuit. The terminal regions 14–23, inclusive, are positioned at the edges of the semiconductor member 13 and preferably are surface conductive regions having cross sections comprising substantially circular segments bounded by chords at the edges of the semiconductor member. The terminal regions preferably are conductive regions of, for example, copper connected to other regions of the semiconductor member 13 by suitable conductive regions on the semiconductor member.

The interconnection structure also includes a plurality of solid-state members 24–28, inclusive, similar to the solid-state member 13 and having terminal regions at the edges thereof. The conductive terminals 11 extend to a surface of the support 10 in a predetermined pattern corresponding to the terminal regions of the solid-state members. The solid-state members 13 and 24–28, inclusive, are positioned on the insulating support with the terminal regions 14–23, of the solid-state state members in close proximity to and in register with the terminals 11 of the support. The terminal regions of the solid-state members are bonded to the terminals of the support, as will now be described.

In accordance with the invention, a method of making an interconnection structure for a solid-state member comprises positioning a solid-state member, such as the member 13, having terminal regions 14–23 at an edge thereof on a support 10 having conductive terminals 11 extending through a surface thereof in a predetermined pattern corresponding to the terminal regions of the solid-state member with the terminal regions of the solid-state member in close proximity to and in register with the terminals of the support. The method comprises the step of masking the support and the solid-state member to expose the terminals of the support and the terminal regions of the solid-state member. The method also comprises depositing conductive material on the terminals of the support and the terminal regions of the solid-state member to bond together the terminals of the support and the terminal regions of the solid-state member.

The conductive terminals 11, inclusive, of the support preferably have cross sections comprising substantially circular segments bounded by chords corresponding in length to the chords of the terminal regions of the solid-state member and the terminal regions 14–23 of the solid-state member are positioned with the chords thereof in close proximity to and in register with the chords of the terminals of the support. Also, the conductive terminals 11 may be of circular cross section and positioned with the circumference of the cross section of each terminal contigous with the corresponding terminal region of the solid-state member.

The masking of the support and the solid-state member may be accomplished by an inexpensive mask having a mechanically-stamped aperture pattern therein corresponding to the terminal pattern of the support. The apertures of the mask may, for example, be substantially circular apertures of a diameter substantially equal to the aforesaid chord length of the terminals, or may be suitable elliptical apertures.

The conductive material may be deposited on the terminals 11 of the support and the terminal regions 14–23 of the solid-state member to bond together the terminals of the support and the terminal regions of the solid-state member by vacuum deposition or by other suitable methods. When utilizing vacuum deposition of copper, it is desirable to clean the surfaces of the terminal regions 14–23 and the terminals 11 of the support by ion bombardment to remove any metallic oxides or other adsorbed films from the surfaces. The conductive material deposited then forms a true metal-to-metal contact with the terminals of the support and the terminal regions of the solid-state member and the bond appears as a single homogenous piece of metal without an interface between the layers of couper when the terminals 11 and terminal regions 14–23 are of copper.

When positioning the mask over the solid-state members and the support, the apertures of the mask are positioned to expose the terminals 11 of the support and the terminal regions 14–23 of the solid-state members. That is, the mask is positioned in relation to the terminals in such a manner that one-half of each projected aperture falls on the pin of a terminal 11 and the other half of the projected aperture falls on the corresponding terminal terminal region of the solid-state member. The terminal regions of the group of solid-state members and the terminals of the support may then be cleaned by ion bombardment through the mask and the copper may subsequently be deposited through the mask to form the desired bonds. The layer of deposited copper may, for example, be of .0015 inch in thickness.

From the foregoing description, it will be apparent that the method of making interconnection structures for solid-state members in accordance with the invention has the advantage of being simple and economical. The method does not require individual handling and bonding of each terminal region and terminal of the support. The solid-state circuit members constructed in accordance with the invention have the advantage that they are readily adapted for interconnection to a suitable support without requiring interconnection wires from the terminal regions of the solid-state member to the terminals of the support. The interconnection structure has the advantage of improved reliability due to the elimination of wire connections and due to the minimizing of interfaces between contact regions.

The yield of interconnection structures constructed in accordance with the method of the invention is substantially greater than the yield heretofore obtained from other methods of making interconnection structures for solid-state circuit members.

It should be understood that the method of the present invention can be utilized to connect a solid-state member to an interconnection structure having conductive terminals but not including a printed circuit integral with the structure. Such an interconnection structure can be connected by means of the terminals of the structure to a suitable external circuit.

While there has been described what is at present believed to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

Having thus described my invention, what I claim and desire to protect by Letters Patent is:

1. A method of making an interconnection structure for a solid-state member comprising:
   positioning a solid-state member having terminal regions at an edge therof on an insulating support having conductive terminals extending through a surface thereof in a predetermined pattern corresponding to said terminal regions of said solid-state member with said terminal regions of said solid-state member in close proximity to and in register with said terminals of said support;
   masking said support and said solid-state member to expose said terminals of said support and said terminal regions of said solid-state member; and
   depositing conductive material on said terminals of said support and said terminal regions of said solid-state member to bond together said terminals of said support and said terminal regions of said solid-state member.

2. A method of making an interconnection structure for a solid-state member comprising:
   forming a solid-state member having terminal regions at an edge thereof;
   forming a support having conductive terminals extending through a surface thereof in a predetermined pattern corresponding to said terminal regions of said solid-state member;
   positioning said solid-state member on said insulating support with said terminal regions of said solid-state member in close proximity to and in register with said terminals of said support;
   masking said support and said solid-state member to expose said terminals of said support and said terminal regions of said solid-state member; and
   depositing conductive material on said terminals of said support and said terminal regions of said solid-state member to bond together said terminals of said support and said terminal regions of said solid-state member.

3. A method of making an interconnection structure for a solid-state member comprising:
   positioning a solid-state member having at an edge thereof terminal regions with cross sections comprising substantially circular segments bounded by chords at said edge on a support having conductive terminals with cross sections comprising substantially circular segments bounded by chords corresponding in length to said chords of said terminal regions of said solid-state member, said conductive terminals extending through a surface of said support with said chords thereof in a predetermined pattern corresponding to said chords of said terminal regions of said solid-state member, said terminal regions of said solid-state member being positioned with said chords thereof in close proximity to and in register with said chords of said terminals of said support;
   masking said support and said solid-state member to expose said terminals of said support and said terminal regions of said solid-state member; and
   depositing conductive material on said terminals of said support and said terminal regions of said solid-state member to bond together said terminals of said supports and said terminal regions of said solid-state member.

4. A method of making an interconnection structure for a solid-state member comprising:
   positioning a solid-state member having terminal regions at an edge thereof on a support having conductive terminals extending through a surface thereof in a predetermined pattern corresponding to said terminal regions of said solid-state member;
   masking said support and said solid-state member with a mask having substantially circular apertures therein corresponding in position to said terminals of said support to expose said terminals of said support and said terminal regions of said solid-state member; and
   depositing conductive material by vacuum deposition on said terminals of said support and said terminal regions of said solid-state member to bond together said terminals of said support and said terminal regions of said solid-state member.

5. A method of making an interconnection structure for a plurality of solid-state members comprising:
   forming a plurality of solid-state members individually having terminal regions at edges thereof;
   forming a support having conductive terminals extending through a surface thereof in a predetermined pattern having individual portions corresponding to individual terminal regions of individual solid-state members;
   positioning said solid-state members on said support with said terminal regions of said solid-state members in close proximity to and in register with said terminals of said support;
   masking said support and said solid-state members to expose said terminals of said support and said terminal regions of said solid-state members; and
   depositing conductive material on said terminals of said support and said terminal regions of said solid-state members to bond together said terminals of said support and said terminal regions of said solid-state members.

6. A method of making an interconnection structure for a plurality of solid-state members in accordance with claim 5 which includes the step of forming on another surface of said support a multi-layer interconnection network connected to said terminals of said support.

References Cited

UNITED STATES PATENTS

| | | | |
|---|---|---|---|
| 3,195,026 | 7/1965 | Wegner et al. | 317—234 |
| 3,307,239 | 3/1967 | Lepselter et al. | 29—577 |

WILLIAM I. BROOKS, *Primary Examiner.*

U.S. Cl. X.R.

29—578, 589, 626; 174—52